US009245990B2

(12) United States Patent
Cho et al.

(10) Patent No.: US 9,245,990 B2
(45) Date of Patent: Jan. 26, 2016

(54) SILICON-COMPATIBLE GERMANIUM-BASED TRANSISTOR WITH HIGH-HOLE-MOBILITY

(71) Applicants: Gachon University of Industry-Academic cooperation Foundation, Seongnam-si (KR); Seoul National University R&DB Foundation, Seoul (KR)

(72) Inventors: Seongjae Cho, Seoul (KR); Byung-Gook Park, Seoul (KR)

(73) Assignees: Gachon University of Industry-Academic cooperation Foundation (KR); Seoul National University R&DB Foundation (KR)

( * ) Notice: Subject to any disclaimer, the term of this patent is extended or adjusted under 35 U.S.C. 154(b) by 0 days.

(21) Appl. No.: 14/556,327

(22) Filed: Dec. 1, 2014

(65) Prior Publication Data

US 2015/0155376 A1    Jun. 4, 2015

(30) Foreign Application Priority Data

Nov. 29, 2013  (KR) .......................... 10-2013-0147924

(51) Int. Cl.
  *H01L 29/778*  (2006.01)
  *H01L 29/12*   (2006.01)
(52) U.S. Cl.
  CPC .......... *H01L 29/7782* (2013.01); *H01L 29/122* (2013.01)

(58) Field of Classification Search
  CPC .......................... H01L 29/7782; H01L 29/12
  USPC ................................................ 257/192–200
  See application file for complete search history.

(56) References Cited

U.S. PATENT DOCUMENTS

| 8,835,988 | B2* | 9/2014 | Marino et al. ............... 257/200 |
| 8,981,427 | B2* | 3/2015 | Hydrick et al. ............. 257/190 |
| 2014/0103397 | A1* | 4/2014 | Pillarisetty et al. ......... 257/192 |

FOREIGN PATENT DOCUMENTS

| KR | 10-0585111 | 6/2006 |
| KR | 10-0644811 | 11/2006 |

* cited by examiner

*Primary Examiner* — Cuong Q Nguyen
(74) *Attorney, Agent, or Firm* — Gerald E. Hespos; Michael J. Porco; Matthew T. Hespos

(57) ABSTRACT

The present invention provides a silicon-compatible germanium-based high-hole-mobility transistor with high-hole-mobility germanium channel comprising a semiconductor material having a valence band offset instead of the conventional gate insulating film, a germanium channel region, and a quantum well formed by heterojunctions of the upper and lower portions of the germanium channel on a silicon substrate. Thus, the present invention enables to gain maximum hole mobility of the germanium channel by using the two-dimensional hole gas gathered into the quantum well for high-speed and low-power operations and device reliability improvement.

12 Claims, 4 Drawing Sheets

FIG. 3(a)
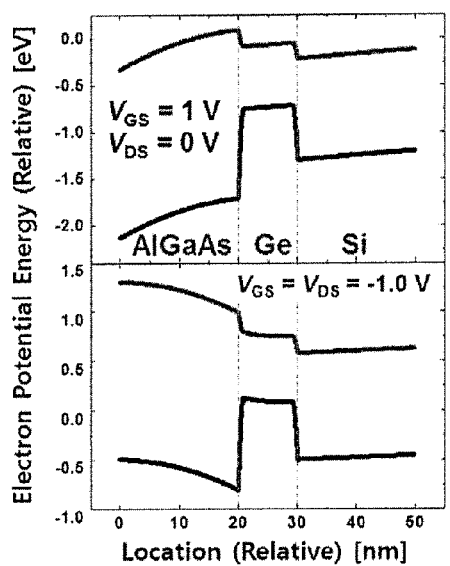
FIG. 3(b)
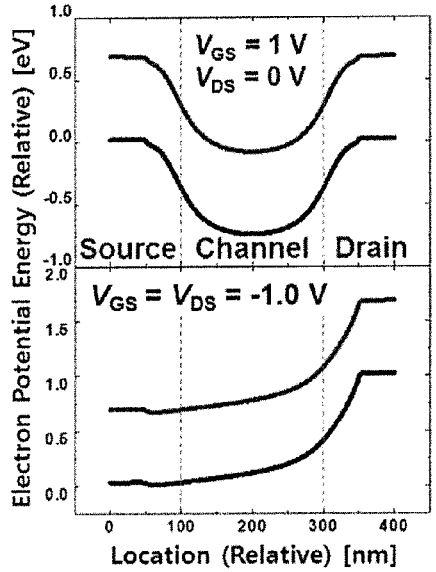
FIG. 3(c)
FIG. 3(d)
FIG. 4
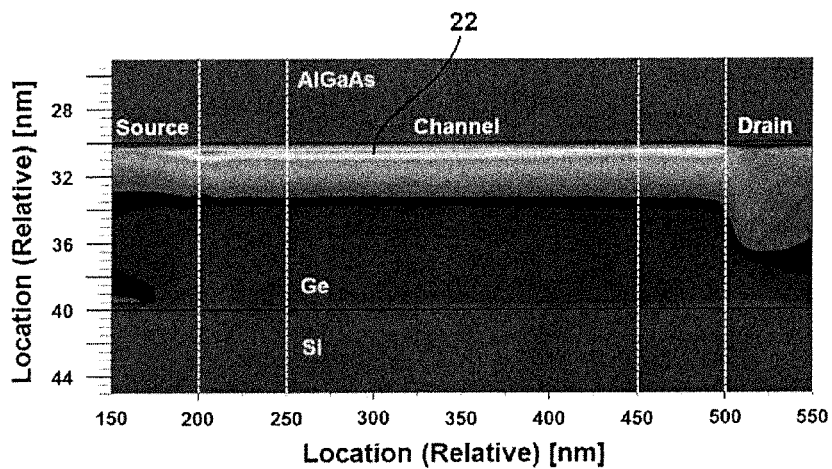

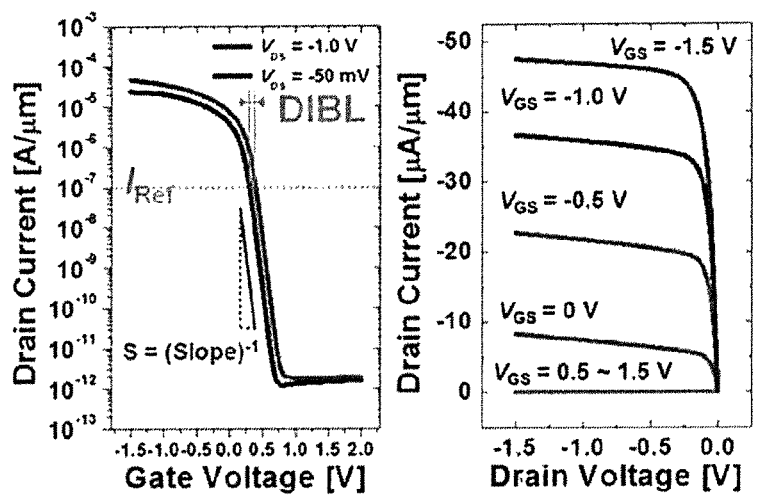
FIG. 5 (a)　　　FIG. 5(b)
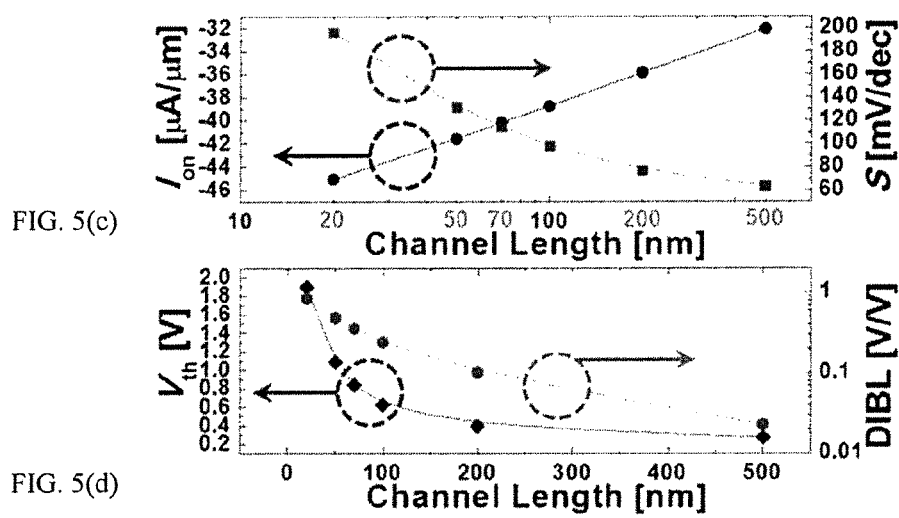
FIG. 5(c)
FIG. 5(d)

SILICON-COMPATIBLE GERMANIUM-BASED TRANSISTOR WITH HIGH-HOLE-MOBILITY

CROSS-REFERENCE TO RELATED APPLICATION

This application claims priority under 35 U.S.C. 119 of Korean Patent Application No. 10-2013-0147924 filed on Nov. 29, 2013, the entire contents of which are hereby incorporated by reference.

BACKGROUND

1. Field of the Invention

The present invention relates to a semiconductor transistor, and more particularly to a silicon-compatible germanium-based high-hole-mobility transistor (HHMT) with high-hole-mobility.

2. Description of the Related Art

Throughout the history of semiconductor transistor development, a large number of high-electron-mobility transistors (HEMTs) using high-electron-mobility have been studied actively, but only a few high-hole-mobility transistors (HH-MTs) with high-hole-mobility are studied.

This is because a large number of semiconductor materials having high-electron-mobility are present, but the semiconductor materials having high-hole-mobility are extremely rare.

Germanium has recently been studied for implementing germanium-based p-type metal-oxide-semiconductor field effect transistors (MOSFETs) due to its intrinsically high-hole-mobility. However, there have been a complexity of the manufacturing processing and a limitation of techniques for getting enough high hole mobility of germanium because of a high channel doping concentration required inevitably in a highly scaled channel.

For example, Korean Patent Nos. 10-0585111 and 10-0644811 disclose techniques for getting carrier mobility of channel higher than that of silicon by forming a germanium channel region. However, there have been such problems that it is difficult to form an oxide film as a gate insulating film on a germanium channel region unlike silicon and to get enough high hole mobility of a germanium channel because of a carrier scattering and the like at the interface between an oxide film and a germanium channel though the gate insulating film being formed of any oxide on the germanium channel region.

SUMMARY OF THE INVENTION

The present invention is contrived to overcome the mentioned problems. Also, the objective of the present invention is to provide a silicon-compatible germanium-based high-hole-mobility transistor with a high-hole-mobility germanium channel and a semiconductor material having a predetermined or more valence band offset to insulate a gate from the germanium channel instead of the conventional gate insulating film, e.g., the oxide film, to be able to be formed on a silicon substrate and to prevent a leakage current from the silicon substrate.

To achieve the objectives, a transistor comprising: a silicon substrate; a germanium layer formed on the silicon substrate; a semiconductor material pattern formed on the germanium layer by a heterojunction, the semiconductor material pattern having a lattice constant 2% or less different from that of the germanium layer and a predetermined or more valence band offset $\Delta E_v$ from below a valence band edge of the germanium layer; a gate formed on the semiconductor material pattern; and source and drain regions formed separately in the germanium layer at both sides of the semiconductor material pattern.

The semiconductor material pattern may be formed of $Al_xGa_{1-x}As$, and the aluminum (Al) fraction, x, may be x<0.7.

The germanium layer may form a channel region between the source and drain regions, the channel region may have a quantum well formed by heterojunctions with the semiconductor material pattern and the silicon substrate, and a two-dimensional hole-gas flow may be formed between the source and drain regions through the quantum well in an ON state.

The two-dimensional hole-gas flow may be concentrated at the interface between the semiconductor material pattern and the channel region in the quantum well.

The channel region may be an intrinsic undoped region, and the semiconductor material pattern, the source region, the drain region and the silicon substrate may be doped with p-type impurities.

The channel region may be formed at the bottom of a trench formed in the germanium layer between the source and drain regions, and the semiconductor material pattern may have a shape filled in the trench.

The thickness of the channel region may be 10~30 nm.

The present invention provides a quantum well formed by heterojunctions of the upper and lower portions of germanium channel region contacting with a gate insulating film formed of semiconductor material having a valence band offset and a silicon substrate, respectively. It is possible to gain the maximum hole mobility of germanium by using the two-dimensional hole gas gathered into the quantum well and to have the effects of high speed, low power operation and device reliability improvement.

The present invention can omit an oxide film step, etc. for simplification and easiness of a fabricating process. Especially, the present invention can be fabricated together with optoelectronic elements in silicon photonics and optoelectronic integrated circuit systems in which germanium is used as a light emitting layer on a silicon substrate.

BRIEF DESCRIPTION OF THE DRAWINGS

FIGS. 3(A)-3(D) are the energy-band diagrams [FIG. 3(A) and FIG. 3(C)] and [FIG. 3(B) and (FIG. 3D)] obtained in the vertical direction from a semiconductor material pattern 30 to a silicon substrate 10 and in the horizontal direction from a source region 24 to a drain region 26 through a channel region 21, respectively, when a voltage is applied in an OFF state [FIG. 3(A) and FIG. 3(B)] or an ON state [FIG. 3(C) and FIG. 3(D)].

FIG. 4 is a simulation result showing a two-dimensional hole gas 22 formed in a channel region 21 when a voltage is applied in the ON state [(C) and (D)] of FIG. 3.

FIGS. 5(A)-5(D) are simulation results showing electrical characteristics of FIG. 1. FIG. 5(A) and FIG. 5(B) show transfer and output characteristics, respectively, where a channel length is $L_G$=200 nm, a germanium layer thickness of a channel region is $T_{Ge}=10$ nm, and an aluminum Al fraction x of a semiconductor material pattern $Al_xGa_{1-x}As$ is x=0.3. FIG. 5(C) and FIG. 5(D) show a driving current $I_{on}$ and a subthreshold swing S depending on a channel length and a threshold voltage $V_{th}$ and a drain-induced barrier lowering DIBL, respectively.

FIGS. 6(A)-6(C) are simulation results showing electrical characteristics according to a germanium layer thickness $T_{Ge}$ of a channel region, where a channel length is $L_G=200$ nm and an aluminum Al fraction x of a semiconductor material pattern $Al_xGa_{1-x}As$ is x=0.3. FIG. 6(A) shows an operation current and ON/OFF current ratio, FIG. 6(B) shows a subthreshold swing S, and FIG. 6(C) shows a leakage current $I_{off}$.

FIG. 7(A) shows an operation current $I_{on}$ and ON/OFF current ratio, FIG. 7(B) shows a subthreshold swing S, and FIG. 7(C) shows a threshold voltage $V_{th}$.

Figure 1:
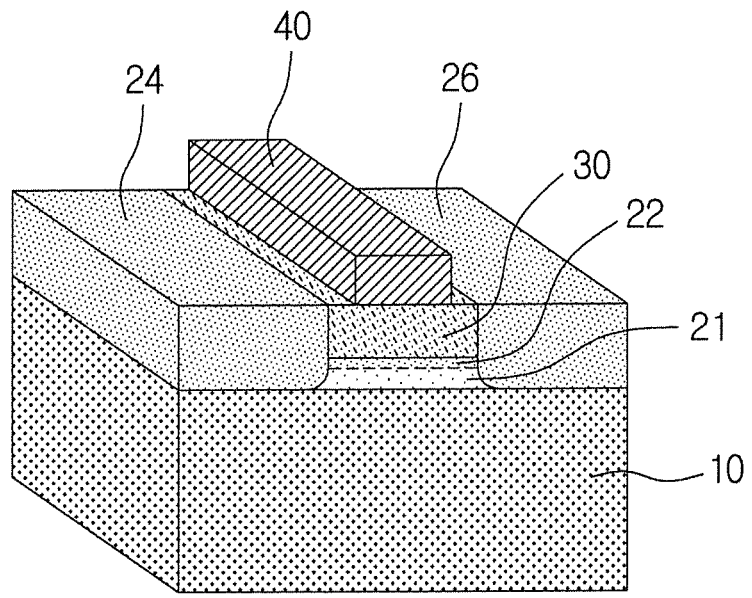
FIG. 1 is a perspective view of a transistor structure, especially, a simulated structure according to an embodiment of the present invention showing a two-dimensional hole gas 22 formed in a channel region 21 when a voltage is applied in an ON state.

In these drawings, the following reference numbers are used throughout: reference number 10 indicates a silicon substrate, 20 a germanium layer, 21 a channel region, 22 a two-dimensional hole gas, 24 a source region, 26 a drain region, 30 a semiconductor material pattern, and 40 a gate.

DETAILED DESCRIPTION

Detailed descriptions of preferred embodiments of the present invention are provided below with accompanying drawings.

A transistor according to an embodiment of the present invention comprises, as commonly shown in FIGS. 1 and 2, a silicon substrate 10; a germanium layer 20 formed on the silicon substrate 10; a semiconductor material pattern 30 formed on the germanium layer 20 by a heterojunction, a the semiconductor material pattern 30 having a lattice constant 2% or less different from that of the germanium layer 20 and a predetermined or more valence band offset ΔEv from below a valence band edge of the germanium layer 20; a gate 40 formed on the semiconductor material pattern 30; and source and drain regions 24 and 26 formed separately in the germanium layer 20 at both sides of the semiconductor material pattern 30.

Here, the semiconductor material pattern 30 replaces an oxide film used as the conventional gate insulating film. Also, it is preferable that the semiconductor material pattern 30 is formed of semiconductor materials having the following physical characteristic.

First, the semiconductor material pattern 30 may be formed on the germanium layer 20 by a heterojunction, wherein it is preferable that a lattice constant of the semiconductor material pattern 30 is 2% or less different from that of the germanium layer 20. By this configuration, the semiconductor material pattern 30 can be formed with a minimum lattice mismatch through a crystalline growth on a channel region 21 of the germanium layer 20. Thus, this configuration enables to remove the factors which suppress the flow of carriers, namely the below mentioned flow of a two-dimensional hole gas, at the junction interface between the semiconductor material pattern 30 and the channel region 21 and to obtain the maximum hole mobility of the germanium channel region 21. In other words, if the semiconductor material pattern 30 is formed of a semiconductor material having a lattice constant more than 2% different from that of germanium, it is difficult to gain the maximum hole mobility as one of the objectives of the present invention.

Second, because the semiconductor material pattern 30 can replace the conventional gate insulating films formed of various oxide films, it is preferable that the semiconductor material to form the semiconductor material pattern 30 is selected to have a predetermined or more valence band offset ΔEv from below a valence band edge of the germanium layer 20. Here, the valence band offset ΔEv may have a size only to confine hole carriers, i.e., a two-dimensional hole gas, e.g., to form at least one side wall of a quantum well mentioned below for protecting the hole carriers in the channel region 21.

An exemplary material to form the semiconductor material pattern 30 is $Al_xGa_{1-x}As$. If the above conditions are satisfied, it is not limited to $Al_xGa_{1-x}As$.

In case of $Al_xGa_{1-x}As$, the valence band offset ΔEv against germanium is calculated by Equation 1, and it surely meets the second condition.

$$\Delta Ev = 0.834 + 0.147x \text{ [eV]} \quad (1)$$

Here, x is a mole fraction of aluminum (Al) and is preferably x<0.7. This is because when x is 0.7, the lattice constant becomes similar to that of germanium allowing good compatibility on the germanium layer 20, but when x is more than 0.7, the lattice constant becomes greater than that of germanium and it causes a process difficulty.

GaAs, as x=0, also guarantees the good compatibility on the germanium (Ge) layer because GaAs has a lattice constant equal to that of Ge, and it completely satisfies the first condition.

The germanium layer 20 can be formed on the silicon substrate 10 by a heterojunction. Because of about 4% lattice mismatch with silicon, it can be just grown to a predetermined thickness through a crystalline growth. However, it is possible to form SiGe firstly on the silicon substrate and then the germanium layer 20 can be formed on the interposed SiGe. Thus, the words of "the germanium layer 20 is formed on the silicon substrate 10" in this description should be interpreted to cover the previous two cases.

Also, the germanium layer 20 is used to form a channel region 21 in many different forms according to the concrete shapes of the transistor devices. As shown in FIG. 2, a germanium layer 20 formed on a silicon substrate 10 can be just used to form separately source 24 and drain 26 regions and then a channel region 21 is interposed between the source and drain regions. Also, as shown in FIG. 1, a trench is formed in the germanium layer 20, a semiconductor material pattern 30 can be embodied as a shape filled in the trench, source 24 and drain 26 regions can be formed in the germanium layer 20 at both sides of the semiconductor material pattern 30, and the germanium layer 20 as the bottom of the trench under the semiconductor material pattern 30 can be used as a channel region 21. Thus, the invented device cannot be limited to the structures mentioned above and can be in various structures according to the fabricating processes.

The fabricating processes of the transistors according to the present invention can be a little bit different from each other depending on concrete device structures, but it can commonly form a germanium layer 20, a semiconductor material pattern 30 and the like on a silicon substrate 10 through a crystalline growth. Thus, it is possible to omit many steps related to fabricating an oxide film essentially processed for forming the conventional gate insulating film or for removing the dangling bond states generated at the interface between the gate insulating film and the germanium channel region. Therefore, it has advantages to simplify the fabrication processes and make them easier.

Figure 2:
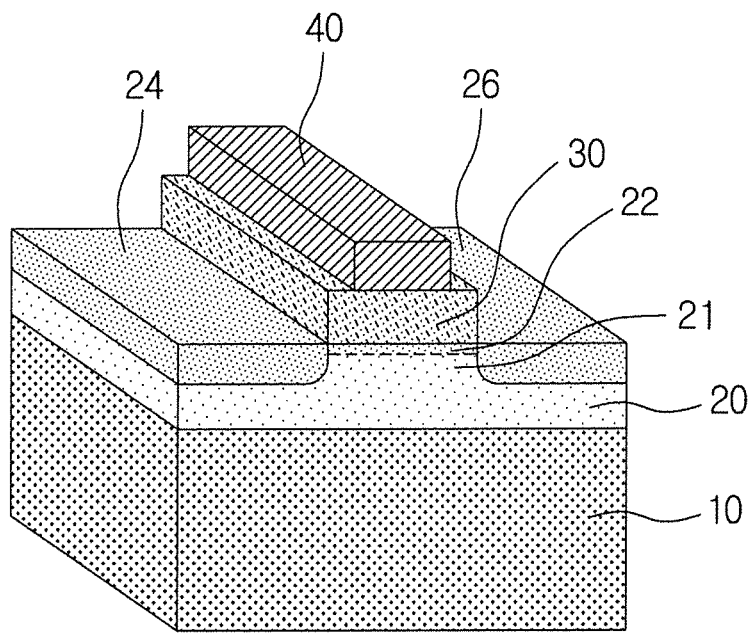
FIG. 2 is a perspective view of a transistor structure according to another embodiment of the present invention showing a two-dimensional hole gas 22 formed in a channel region 21 when a voltage is applied in an ON state.

On the other hand, the device structure of FIG. 1 offers favorable advantages compared with the structure of FIG. 2, for maintaining high-speed operation capability, etc., because the gate 40 has an excellent channel control.

According to the structure of FIG. 1, the thickness of the channel region, namely the thickness of the germanium layer 20 of the channel region is preferably 10~30 nm. This is based on the simulation result on the electrical characteristics according to the germanium layer thickness $T_{Ge}$ when the channel length is $L_G$=200 nm, and the aluminum Al fraction x of the semiconductor material pattern $Al_xGa_{1-x}As$ is x=0.3 in the structure of FIG. 1. When the germanium layer thickness $T_{Ge}$ of the channel region is larger than 30 nm, the gate 40 loses the channel control and the driving current $I_{on}$ gain is slight, but the ON/OFF current ratio drops [refer to FIG. 6(A)], the subthreshold sing S increases for the switching characteristic loss [refer to FIG. 6(B)], and the leakage current $I_{off}$ increases [refer to FIG. 6(C)]. When the germanium layer thickness $T_{Ge}$ is less than 10 nm, the lattice mismatch between the germanium layer 21 and the silicon substrate 10 can induce defective effects on hole mobility.

As shown in FIGS. 1 and 2, when the germanium layer 20 or the germanium channel region 21 contacts to form a heterojunction with the silicon substrate 10, because germanium can have a valence band offset ΔEv from below a valence band edge of silicon, as shown in FIGS. 3(A) and 3(C), a quantum well to trap holes can be formed in the germanium channel region 21 not only in the OFF state [FIG. 3(A)], but also in the ON state [FIG. 3(C)] as shown in the energy-band diagrams obtained in the vertical direction from a semiconductor material pattern 30 to a silicon substrate 10.

By this configuration, according to a voltage applied to a device, a flow of two-dimensional hole gas between source and drain regions can occur through the quantum well and realize high-speed and low-power operations.

Especially, at the ON operation of the device, it is preferable that the two-dimensional hole gas 22, as shown in FIGS. 1 and 2, is concentrated at the interface between the semiconductor material pattern 30 and the channel region 21. This is because the above configuration can prevent the hole-mobility loss by the lattice mismatch at the opposite side of the interface of the quantum well, namely at the interface between the germanium channel layer 21 and the silicon substrate 10, and realize the high-speed and low-power operations.

FIG. 4 is a simulation result diagram showing a two-dimensional hole gas 22 formed at the upper interface of a channel region 21 when a voltage is applied as the ON state [(C) and (D)] of FIG. 3.

FIG. 5 is a simulation result showing electrical characteristics of FIG. 1. FIG. 5(A) and FIG. 5(B) show transfer and output characteristics, respectively, where a channel length is $L_G$=200 nm, a germanium layer thickness of a channel region is $T_{Ge}$=10 nm, and an aluminum Al fraction x of a semiconductor material pattern $Al_xGa_{1-x}As$ is x=0.3. FIG. 5(C) and FIG. 5(D) show a driving current $I_{on}$ and a subthreshold swing S depending on a channel length and a threshold voltage $V_{th}$ and a drain-induced barrier lowering DIBL, respectively.

Figure 6A:
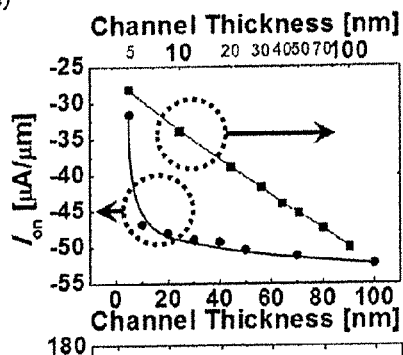
Figure 6A:
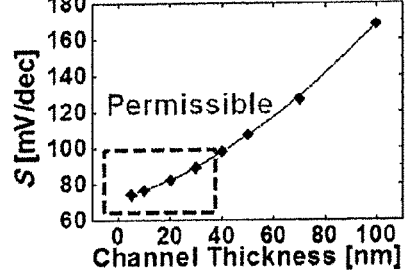
Figure 6A:
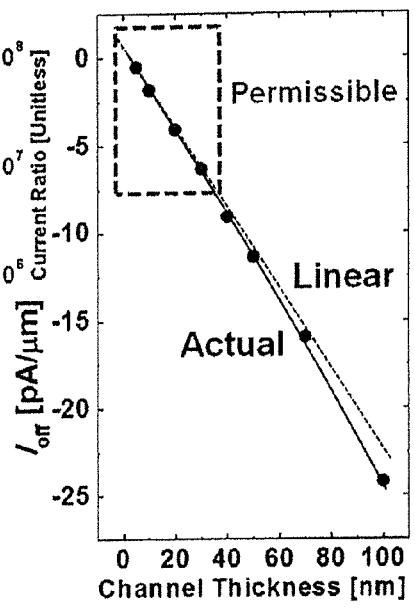

FIG. 6 is a simulation result showing electrical characteristics according to a germanium layer thickness $T_{Ge}$ of a channel region, where a channel length is $L_G$=200 nm and an aluminum Al fraction x of a semiconductor material pattern $Al_xGa_{1-x}As$ is x=0.3. FIG. 6(A) shows an operation current and ON/OFF current ratio, FIG. 6(B) shows a subthreshold swing S, and FIG. 6(C) shows a leakage current Ioff.

Figure 7A:
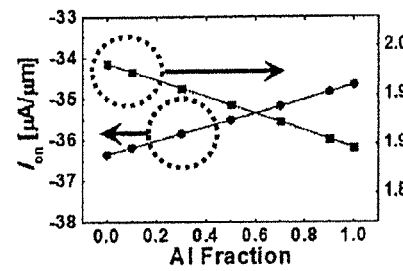
FIGS. 7(A)-7(C) is a simulation result showing electrical characteristics according to an aluminum Al fraction x of a semiconductor material pattern $Al_xGa_{1-x}As$, where a channel length is $L_G=200$ nm, a germanium layer thickness of a channel region is $T_{Ge}=10$ nm.
Figure 7B:
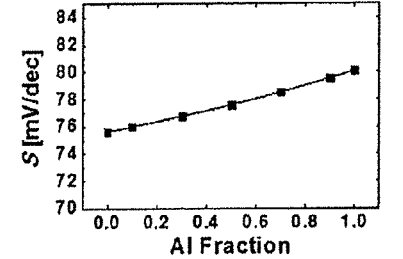
Figure 7C:
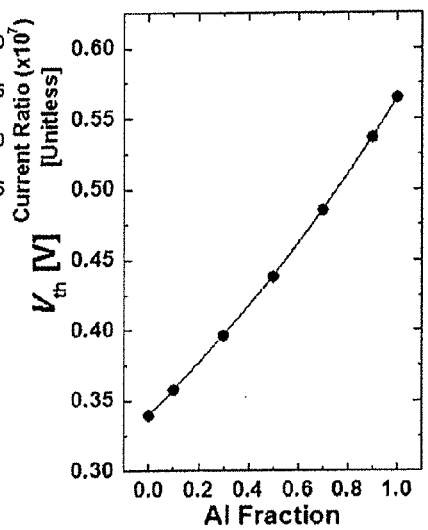

FIG. 7 is a simulation result showing electrical characteristics according to an aluminum Al fraction x of a semiconductor material pattern $Al_xGa_{1-x}As$, where a channel length is $L_G$=200 nm, a germanium layer thickness of a channel region is $T_{Ge}$=10 nm. FIG. 7(A) shows an operation current $I_{on}$ and ON/OFF current ratio, FIG. 7(B) shows a subthreshold swing S, and FIG. 7(C) shows a threshold voltage $V_{th}$.

FIGS. 3 to 7 are based on the p-type germanium high-hole-mobility transistor (p-GeHHMT), as the structure of FIG. 1. The channel region 21 is an intrinsic undoped region, and the semiconductor material pattern 30, the source region 24, the drain region 26 and the silicon substrate 10 are doped with p-type impurities.

Also, although the unmentioned gate 40 material can be formed of any conductive materials, the simulation results of FIGS. 3 to 7 are obtained by the gate 40 made of Al in FIG. 1.

This work was supported by the Center for Integrated Smart Sensors funded by the Korean Ministry of Science, ICT & Future Planning as Global Frontier Project (CISS-2012M3A6A6054186).

What is claimed is:

1. A transistor comprising:
    a silicon substrate;
    a germanium layer formed on the silicon substrate;
    a semiconductor material pattern formed on the germanium layer by a heterojunction, the semiconductor material pattern having a lattice constant 2% or less different from that of the germanium layer and a predetermined or more valence band offset ΔEv from below a valence band edge of the germanium layer;
    a gate formed on the semiconductor material pattern; and
    source and drain regions formed separately in the germanium layer at both sides of the semiconductor material pattern.

2. The transistor of claim 1, wherein the semiconductor material pattern is formed of $Al_xGa_{1-x}As$, and wherein the aluminum (Al) fraction, x, is x<0.7.

3. The transistor of claim 1, wherein the germanium layer forms a channel region between the source and drain regions, wherein the channel region has a quantum well formed by heterojunctions with the semiconductor material pattern and the silicon substrate, and wherein a two-dimensional hole-gas flow is formed between the source and drain regions through the quantum well in an ON state.

4. The transistor of claim 3, wherein the two-dimensional hole-gas flow is concentrated at the interface between the semiconductor material pattern and the channel region in the quantum well.

5. The transistor of claim 3, wherein the channel region is an intrinsic undoped region, and wherein the semiconductor material pattern, the source region, the drain region and the silicon substrate are doped with p-type impurities.

6. The transistor of claim 3, wherein the channel region is formed at the bottom of a trench formed in the germanium layer between the source and drain regions, and wherein the semiconductor material pattern has a shape filled in the trench.

7. The transistor of claim 3, wherein the thickness of the channel region is 10~30 nm.

8. The transistor of claim 2, wherein the germanium layer forms a channel region between the source and drain regions, wherein the channel region has a quantum well formed by heterojunctions with the semiconductor material pattern and the silicon substrate, and wherein a two-dimensional hole-gas flow is formed between the source and drain regions through the quantum well in an ON state.

9. The transistor of claim 8, wherein the two-dimensional hole-gas flow is concentrated at the interface between the semiconductor material pattern and the channel region in the quantum well.

10. The transistor of claim 8, wherein the channel region is an intrinsic undoped region, and wherein the semiconductor material pattern, the source region, the drain region and the silicon substrate are doped with p-type impurities.

11. The transistor of claim 8, wherein the channel region is formed at the bottom of a trench formed in the germanium layer between the source and drain regions, and wherein the semiconductor material pattern has a shape filled in the trench.

12. The transistor of claim 8, wherein the thickness of the channel region is 10~30 nm.

* * * * *